United States Patent
Aldaz et al.

(10) Patent No.: US 7,732,231 B1
(45) Date of Patent: Jun. 8, 2010

(54) METHOD OF FORMING A DIELECTRIC LAYER ON A SEMICONDUCTOR LIGHT EMITTING DEVICE

(75) Inventors: Rafael I. Aldaz, Pleasanton, CA (US); James G. Neff, Felton, CA (US)

(73) Assignees: Philips Lumileds Lighting Company, LLC, San Jose, CA (US); Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 12/477,222

(22) Filed: Jun. 3, 2009

(51) Int. Cl.
*H01L 21/20* (2006.01)

(52) U.S. Cl. ............... 438/22; 438/26; 438/692

(58) Field of Classification Search ............ 438/22–47, 438/692, 795
See application file for complete search history.

(56) References Cited

U.S. PATENT DOCUMENTS

| | | | |
|---|---|---|---|
| 6,891,197 B2 | 5/2005 | Bhat et al. | |
| 2006/0011937 A1* | 1/2006 | Goetz et al. | 257/103 |
| 2006/0240585 A1 | 10/2006 | Epler et al. | |
| 2006/0273339 A1* | 12/2006 | Steigerwald et al. | 257/99 |
| 2006/0281203 A1* | 12/2006 | Epler et al. | 438/22 |
| 2008/0081397 A1 | 4/2008 | Sun et al. | |
| 2009/0039359 A1* | 2/2009 | Yoon et al. | 257/88 |
| 2009/0140282 A1* | 6/2009 | Wu et al. | 257/99 |
| 2009/0173956 A1* | 7/2009 | Aldaz et al. | 257/94 |

* cited by examiner

*Primary Examiner*—Savitri Mulpuri

(57) ABSTRACT

A semiconductor structure comprising a light emitting layer disposed between an n-type region and a p-type region is formed. A portion of the light emitting layer and the p-type region are removed to expose a portion of the n-type region. A first metal contact is formed on an exposed portion of the n-type region and a second metal contact is formed on a remaining portion of the p-type region. The first and second metal contacts are formed on a same side of the semiconductor structure. A dielectric material is disposed between the first and second metal contacts. The dielectric material is in direct contact with a portion of the semiconductor structure, a portion of the first metal contact, and a portion of the second metal contact. A surface of the device is then planarized by removing a portion of at least one of the first metal contact, the second metal contact, and the dielectric material.

13 Claims, 3 Drawing Sheets

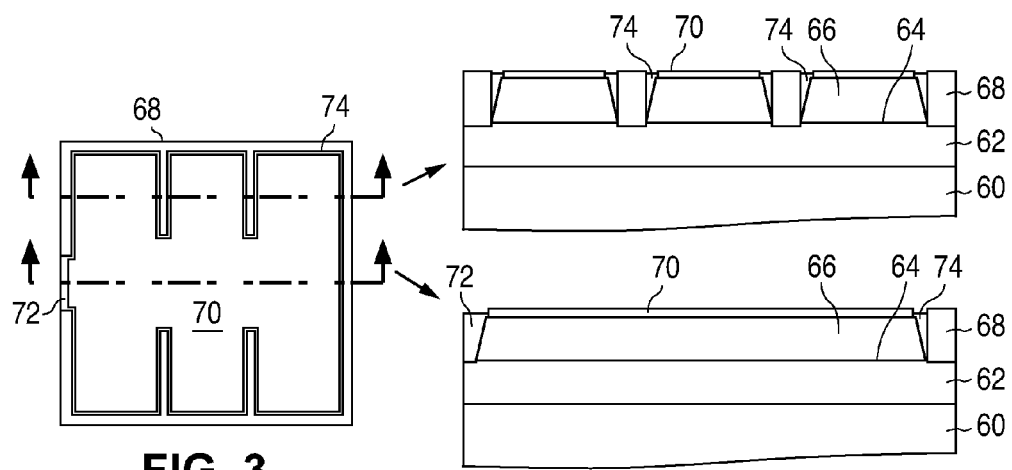
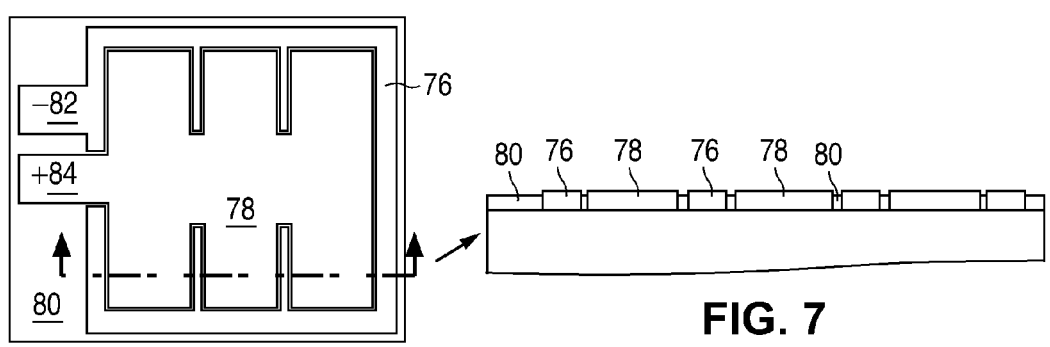

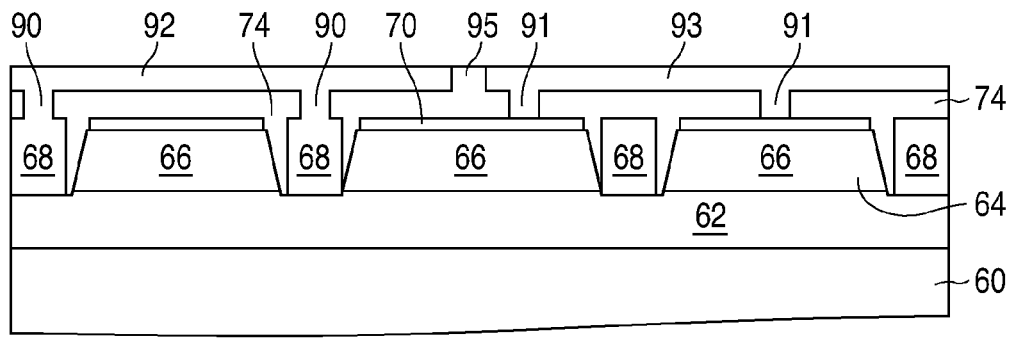
FIG. 8
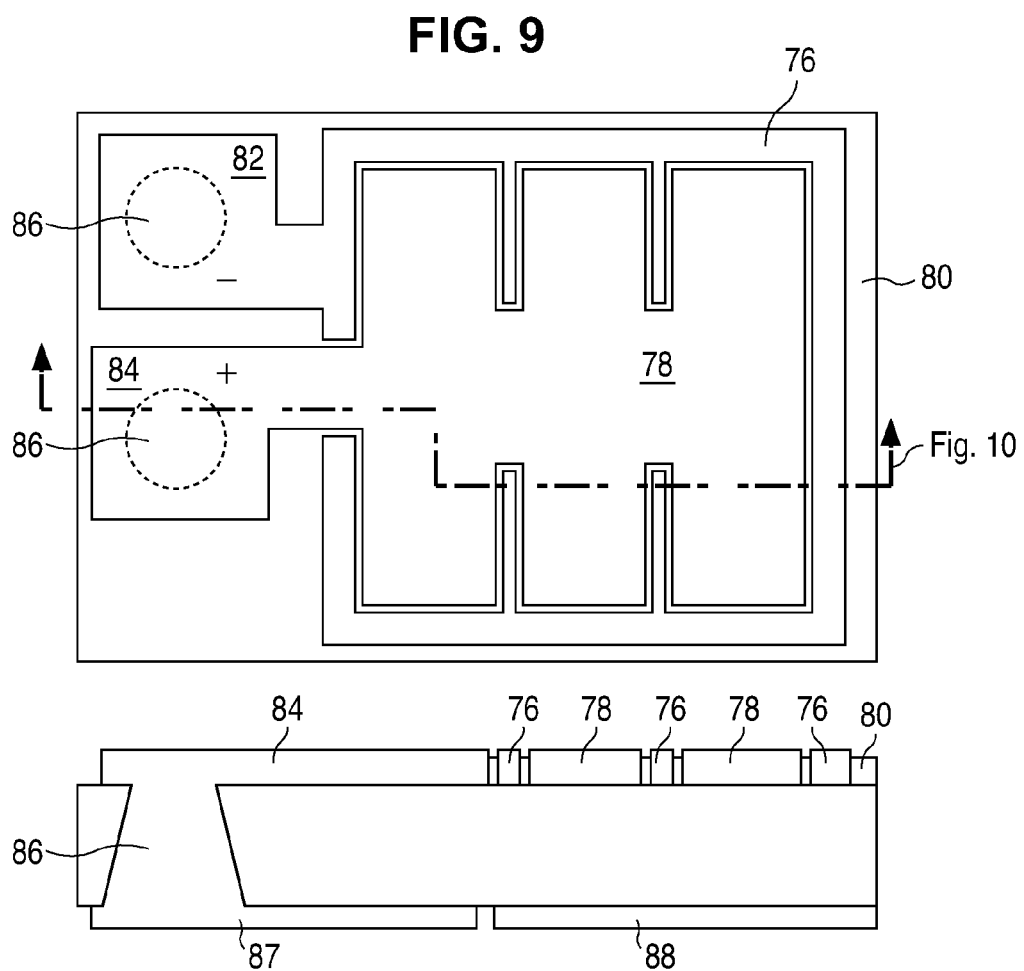
FIG. 9
FIG. 10

METHOD OF FORMING A DIELECTRIC LAYER ON A SEMICONDUCTOR LIGHT EMITTING DEVICE

FIELD OF INVENTION

This invention relates generally to semiconductor devices, and more specifically to using a dielectric layer to support a flip chip semiconductor light-emitting device and to electrically isolate the n- and p-contacts.

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then a light emitting or active region is deposited on the n-type region, then a p-type region is deposited on the active region. The order of the layers may be reversed such that the p-type region is adjacent to the substrate.

FIG. 1 illustrates a semiconductor device 30 described in more detail in US 2008/0081397, which is incorporated herein by reference. Device 30 includes an epitaxial structure 32. The epitaxial structure 32 includes an n-type region 36, which is grown on the substrate 34. The epitaxial structure 32 further includes a light emitting region 38, grown on the n-type region 36, and a p-type region 40, which is grown on the light emitting region 38. In general the n-type region 36, the p-type region 40, and the light emitting region 38 may each include a plurality of layers of different composition and dopant concentration. In one embodiment, where it is desired to remove the substrate 34 after processing, the n-type region 36 may include a release layer (not shown) located between the n-type region and the substrate, for facilitating release of the substrate from the epitaxial structure 32.

A p-metal layer 44, which generally comprises a highly reflective metal, is formed in electrical contact with the p-type region 40. An optional guard layer 46 may be deposited over the p-metal layer 44. The guard layer 46 may be used, for example, when the p-metal layer 44 comprises silver, in which case the guard layer is included to prevent silver from migrating to other parts of the epitaxial structure 32. The guard layer 46 is in electrical contact with the p-metal layer 44. One or more p-electrode metal layers 48 may be deposited over the guard layer 46 and in electrical connection therewith. In the case of a dielectric guard layer, a via hole may be etched through the guard layer to facilitate contact between p-electrode metal layers 48 and p-metal layer 44.

The epitaxial structure 32 further includes one or more voids 50. The voids 50 facilitate electrical connection to the n-type region 36. A dielectric layer 52 is deposited over the guard metal layers 46 and side wall surfaces of the voids 50. The epitaxial structure 32 also includes an n-electrode metal layer 56 deposited over the dielectric layer 52 and the bottom surface of void 50. The n-electrode layer 56 at the bottom of the void 50 is in electrical connection with the n-type region 36, and provides an electrical connection thereto. The dielectric layer 52 electrically insulates the n-electrodes 56 from the p-electrode 48, the guard metal layer 46, and the p-type region 40.

The voids 50 may further include a trench which is operable to electrically insulate the p-electrode 48 from the n-electrodes 56. The voids 50 weaken the semiconductor structure 30, making the structure susceptible to damage during mounting and/or operation. A support material 110 substantially fills the voids 50. The support material 110 is sufficiently solidified to support the semiconductor structure 30 during mounting and/or operation. In one embodiment the support material 110 has a glass transition temperature greater than the operating temperature of the semiconductor light emitting structure 30, such that the support material remains sufficiently rigid to support the semiconductor structure when operating to generate light.

In the embodiment shown the support material 110 overfills the voids 50 and covers at least a portion of an upper surface 112 of the epitaxial structure 32. The support material 110 may be deposited by spin coating a wafer (not shown) including a plurality of semiconductor structures 30. Spin coating involves depositing more than a sufficient quantity of a fluid support material 110, and then spinning the wafer to cause the fluid to form a thin coating over the wafer. Spinning continues until the coating has sufficiently cured through evaporation of solvents, for example. The support material 110 may then be further cured by baking the wafer in an oven to raise the temperature above the support material cure temperature to solidify the support material sufficiently to support the semiconductor structure 30.

Referring to FIG. 2, the process continues by planarizing the wafer. Planarizing may involve mechanical process steps such as lapping the wafer to abrade away excess support material 110. In one embodiment lapping may remove a portion of the n-electrode layer 56 and the p-electrode 48, to provide a substantially flat mounting surface. Mechanical lapping may also be combined with chemical etching.

SUMMARY

It is an object of the present invention to form a semiconductor light emitting device with a dielectric layer that fill any voids in the device and electrically isolates the p- and n-contacts, eliminating the need for a separate non-planar dielectric between the n- and p-contacts.

In embodiments of the invention, a semiconductor structure comprising a light emitting layer disposed between an n-type region and a p-type region is formed. A portion of the light emitting layer and the p-type region are removed to expose a portion of the n-type region. A first metal contact is formed on an exposed portion of the n-type region and a second metal contact is formed on a remaining portion of the p-type region. The first and second metal contacts are formed on a same side of the semiconductor structure. A dielectric material is disposed between the first and second metal contacts. The dielectric material is in direct contact with a portion of the semiconductor structure, a portion of the first metal contact, and a portion of the second metal contact. A surface of the device is then planarized by removing a portion of at least one of the first metal contact, the second metal contact, and the dielectric material.

BRIEF DESCRIPTION OF THE DRAWINGS

FIG. 3 is a plan view of a light emitting device according to embodiments of the invention.

FIGS. 4 and 5 are cross sectional views of the device illustrated in FIG. 3.

FIG. 6 is a plan view of a mount on which the device illustrated in FIG. 3 may be mounted.

FIG. 7 is a cross sectional view of the mount illustrated in FIG. 6.

FIG. 8 is a cross sectional view of a light emitting device with redistributed electrical contacts, according to embodiments of the invention.

FIG. 9 is a plan view of an alternative mount on which the device illustrated in FIG. 3 may be mounted.

FIG. 10 is a cross sectional view of the mount illustrated in FIG. 9.

DETAILED DESCRIPTION

Figure 1:
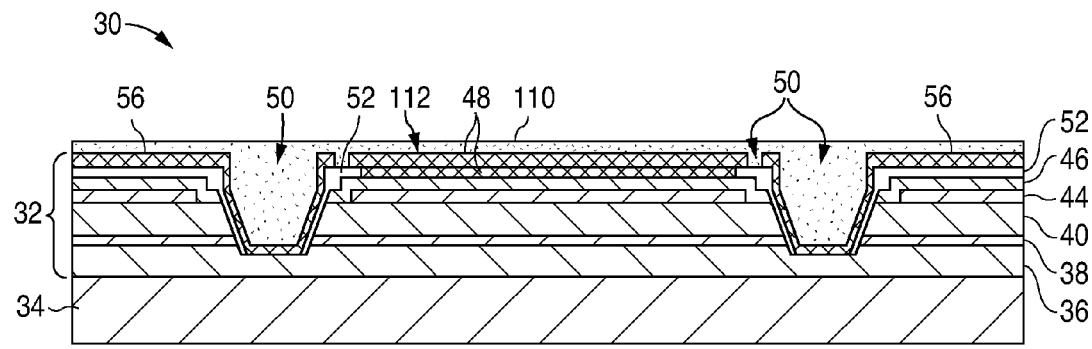
FIG. 1 illustrates a III-nitride light emitting device with a support material filling voids in the device.
Figure 2:
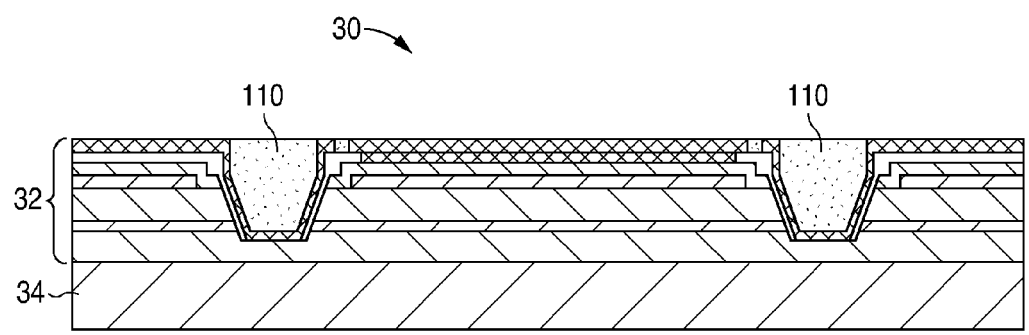
FIG. 2 illustrates the device of FIG. 1 after planarizing the support material to expose the n- and p-electrodes.

The device illustrated in FIGS. 1 and 2 requires a buried intermetal dielectric layer 52. Particles or voids present before or generated during the deposition of buried dielectric layer 52 may cause device shorts. The use of such a dielectric layer 52 requires strict contamination control and wafer cleanliness in order to achieve high manufacturing yields.

In embodiments of the present invention, the dielectric material deposited to support the die also serves to electrically isolate the n- and p-metal contacts, eliminating the need for a buried dielectric layer 52 as illustrated in FIGS. 1 and 2.

FIG. 3 is a plan view of an LED according to embodiments of the device. FIGS. 4 and 5 are cross sectional views along the axes shown in FIG. 3. The LED includes a semiconductor structure, including one or more light emitting layers sandwiched between an n-type region and a p-type region. In some embodiments, the semiconductor structure is a III-nitride structure, and the light emitting layers are configured to emit blue light, though any suitable semiconductor structure, such as any group III-V structure including III-P and III-As structures, may be used. A III-nitride structure is typically grown on a sapphire or SiC growth substrate 60 by growing the n-type region, followed by the light emitting region, followed by the p-type region. The growth substrate may be removed from the semiconductor structure after growth.

The n-type region 62 may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light.

The light emitting region 64 is grown over the n-type region 62. Examples of suitable light emitting regions include a single thick or thin light emitting layer and a multiple quantum well light emitting region including multiple thin or thick quantum well light emitting layers separated by barrier layers. For example, a multiple quantum well light emitting region may include multiple InGaN light emitting layers separated by GaN or InGaN barriers. One or more light emitting layers in the device may be doped, for example with Si, or the light emitting layer or layers may be not intentionally doped.

The p-type region 66 is grown over the light emitting region 64. Like the n-type region, the p-type region may include multiple layers of different composition, thickness, and dopant concentration, including layers that are not intentionally doped, or n-type layers.

A portion of the p-type and light emitting regions are etched away to reveal a surface of the n-type region on which n-electrical contact is formed. N-contact 68 is formed on the exposed portion of n-type region 62 and p-contact 70 is formed on the remaining portion of p-type region 66. In the device illustrated in FIGS. 3-5, the n-contact 68 surrounds the device and includes several fingers which extend toward the center of the device. In some embodiments, the shortest distance between two points on the n-contact is not more than twice the current spreading distance in n-type region 62. In some embodiments, n-contact 68 is thicker than p-contact 70, such that the tops of the n- and p-contacts are at roughly the same height, or such that the top of the n-contact is taller than the top of the p-contact.

A dielectric material 74 electrically isolates the n- and p-contacts 68 and 70. Dielectric material 74 may be, for example, a polymer such as polyimide or benzocyclobutene-based (BCB), or an inorganic material such as silicon dioxide or silicon nitride. Dielectric material 74 may be deposited in such a way that it fills any voids in the device.

The LED illustrated in FIGS. 3-5 is formed by growing the semiconductor structure on the growth substrate, then patterning the semiconductor structure to expose a portion of the n-type region on which the n-contact is formed. In some embodiments, one or more metal layers are then deposited and patterned to form the n- and p-contacts. A thick layer of dielectric material is deposited on the surface to encapsulate the n- and p-contacts and fill any voids between them. The dielectric material 74 may be, for example, spun-on polyimide or silicon nitride formed by plasma-enhanced chemical vapor deposition, chemical vapor deposition, or a suitable vacuum deposition technique. The top surface of the device is then planarized, for example by chemical mechanical polishing (CMP), to remove any dielectric material covering the n- and p-contacts, and to form a planar surface. In some embodiments, the dielectric material remaining between the n- and p-contacts is etched to slightly below the top surface of the n- and p-contacts, to prevent the dielectric material from interfering with bonding the n- and p-contacts to a mount. The etched thickness may be in the order of 100 nm to 500 nm and can be done by wet chemical or plasma etching.

In some embodiments, after patterning the semiconductor structure to expose a portion of the n-type region on which the n-contact is formed, a thick dielectric layer is deposited first. Openings for the n- and p-contacts are patterned into the dielectric, then the n- and p-contacts are formed in the openings, for example by electroplating, evaporation, or any other suitable technique. If BCB is used as the dielectric, openings can be formed lithographically before curing. The top surface of the device is then planarized, for example by CMP, to remove any excess contact metal and to expose the top surface of the dielectric material between the contacts. The dielectric material may then be etched as described above.

The deposition and annealing of metal contact layers may also occur before the patterning of the semiconductor structure in case of the p-contact, or before the deposition of dielectric material 74 in the case of both n- and/or p-contacts. In these cases, the openings in the dielectric material reveal the underlying thin contact layers. The openings are filled with metal and subsequently planarized, as described above. A person of skill in the art will understand that the process steps described above can be reordered in a flexible way to satisfy the requirements for specific contact formation. Such variations are within the scope of the invention.

In some embodiments, a compliant bonding structure is formed on one or both of the p-contact and n-contact planarized surfaces. The compliant bonding structure may be, for example, a group of metal bumps with 1:2 or higher aspect ratios to facilitate bonding of large area metal surfaces. In some embodiments, the bumps may have diameters and heights between 1 and 10 microns. Bumps less than 3 microns tall may be formed by, for example, evaporation and lift-off techniques; taller bumps may be formed by, for example, electroplating. During bonding of the device to a mount, the compliant bonding structure collapses in a solid phase, unlike solder which liquefies during bonding. The compliant bonding structure electrically and mechanically connects the semiconductor structure to the mount. Compliant bonding structures are described in more detail in "Method of Bonding a Semiconductor Device Using a Compliant Bonding Structure," U.S. application Ser. No. 12/397,367, which is incorporated herein by reference.

FIG. 6 is a plan view of a structure on which the device illustrated in FIGS. 3-5 may be mounted. FIG. 7 is a cross sectional view of the mount along the axis indicated in FIG. 6. The mount includes p-contact 78 and n-contact 76, which mirror the p- and n-contacts 70 and 68 on the LED. The p- and n-contacts on the mount are electrically isolated by insulating material 80. N- and p-contact pads 82 and 84 are formed on the mount for electrically connecting the LED to another structure such as, for example, a power source. In some embodiments, on the LED, a portion of the n-contact surrounding the p-type region is removed or omitted. The space is filled with a thick dielectric layer. The dielectric material forms a contact "bridge" 72 which allows a trace to p-contact pad 84 on the mount to electrically connect to the LED's p-contact 70, which is otherwise surrounded by the n-contact 68, without shorting the n-contact 68.

FIG. 9 is a plan view of an alternative mount on which the device illustrated in FIGS. 3-5 may be mounted. FIG. 10 is a cross sectional view of the mount along the axis indicated in FIG. 9. As in FIG. 6, the mount includes p-contact 78 and n-contact 76, which mirror the p- and n-contacts 70 and 68 on the LED. The p- and n-contacts on the mount are electrically isolated by insulating material 80. N- and p-contact pads 82 and 84 are formed on the mount for electrically connecting the LED to another structure such as, for example, a power source. One or more vias 86 may be formed through insulating material 80, to connect the n- and p-contact pads 82 and 84 to contact pads 87 and 88 formed on the bottom of the mount. The via shown in FIG. 10 connects p-contact pad 84 to a p-contact pad 87 on the bottom of the mount.

The LED may be connected to the mount by, for example, solder, a thermocompression bond, an interdiffusion bond, or a Au stud bump array bonded by an ultrasonic weld. Growth substrate 60 may be removed after mounting the LED on the mount, by a process appropriate to the growth substrate such as, for example, laser melting or etching. The semiconductor structure may be thinned after removing the growth substrate, for example by photoelectrochemical etching, and/or textured or patterned, for example with a rough surface or a photonic crystal. A wavelength converting material such as one or more phosphors, and/or other known structures such as a dichroic filter, a polarizer, or a lens or other optical device may be disposed over the semiconductor structure.

In some embodiments, the dielectric material is used to redistribute the n- and p-contacts, as illustrated in FIG. 8. In the device of FIG. 8, the semiconductor structure is grown, then patterned to expose portions of the n-type region 62, then the n- and p-contacts 68 and 70 are formed, then a thick dielectric material 74 is disposed over the structure, as described above in reference to FIGS. 3-5. The dielectric material 74 may be optionally planarized, without exposing the top surfaces of n- and p-contacts 68 and 70. On the left side of the device illustrated in FIG. 8, openings 90 in the dielectric material 74 are formed which align with the n-contacts 68. On the right side of the device illustrated in FIG. 8, openings 91 in the dielectric material 75 are formed which align with the p-contacts 70. The openings are then filled with a conductive material, typically metal. A large area n-contact 92 is formed on the left side of the device and a large area p-contact 93 is formed on the right side of the device. An insulating material 95 is then deposited over and electrically isolates the large area n- and p-contacts 92 and 93. The structure is then planarized, exposing the contacts 92 and 93. A device with large area contacts as illustrated in FIG. 8 may simply the design of the mount.

Embodiments of the invention may have several advantages. The dielectric material is formed by a process that fills all the voids in the device, thus the semiconductor structure is fully supported during and after removal of the substrate, which may reduce the frequency of cracking of the semiconductor during removal of the substrate. The device structure need not include any additional underfill material. The intermetal dielectric described above in reference to FIGS. 1 and 2, which is susceptible to cracking and defects caused by particles and/or voids, is eliminated, which may improve the thermal performance of the device and the yield, by eliminating problems caused by flaws in the intermetal dielectric.

The device is planarized in wafer form, which may eliminate problems associated with non-planarity during flip chip bonding. Also, thick, expensive, plated metal contacts are not required to overcome any non-planarities that may interfere with bonding to the mount.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   forming a semiconductor structure comprising a light emitting layer disposed between an n-type region and a p-type region;
   removing a portion of the light emitting layer and the p-type region to expose a portion of the n-type region;
   forming a first metal contact on an exposed portion of the n-type region and a second metal contact on a remaining portion of the p-type region, wherein the first and second metal contacts are formed on a same side of the semiconductor structure; and
   disposing a dielectric material between the first and second metal contacts, wherein the dielectric material is in direct contact with a portion of the semiconductor structure, a portion of the first metal contact, and a portion of the second metal contact; and
   forming a planar surface, the planar surface including a surface of the first metal contact, a surface of the second metal contact, and a surface of the dielectric material, by removing a portion of at least one of the first metal contact, the second metal contact, and the dielectric material.

2. The method of claim 1 wherein forming a first metal contact and a second metal contact occurs before disposing a dielectric material between the first and second metal contacts.

3. The method of claim 1 wherein:
disposing a dielectric material occurs before forming a first metal contact and a second metal contact; and
disposing a dielectric layer comprises:
   after removing a portion of the light emitting layer and the p-type region, forming a dielectric material over the semiconductor structure; and
   removing portions of the dielectric material to expose portions of the n-type region and the p-type region on which the first and second metal contacts are disposed.

4. The method of claim 1 further comprising etching away a portion of the dielectric material between the first and second metal contacts, after forming a planar surface.

5. The method of claim 1 wherein the dielectric material is one of a polymer, polyimide, and a benzocyclobutene-based material, and wherein disposing a dielectric material comprises disposing the dielectric material by spin-on coating.

6. The method of claim 1 wherein the dielectric material is one of an inorganic material, silicon dioxide, and silicon nitride, and wherein disposing a dielectric material comprises disposing the dielectric material by one of chemical vapor deposition, plasma enhanced chemical vapor deposition, and a vacuum deposition technique.

7. The method of claim 1 wherein forming a planar surface comprises removing material by chemical mechanical polishing.

8. The method of claim 1 wherein after forming a planar surface, dielectric material is disposed over the first metal contact and the second metal contact, the method further comprising:
   forming a first opening in the dielectric material to expose a portion of the first metal contact;
   forming a second opening in the dielectric material to expose a portion of the second metal contact;
   disposing metal in the first and second openings;
   forming a third metal contact in direct contact with the metal in the first opening; and
   forming a fourth metal contact in direct contact with the metal in the second opening.

9. The method of claim 1 wherein:
at least a portion of the first metal contact substantially surrounds the second metal contact; and
a segment of the portion first metal contact which substantially surrounds the second metal contact is omitted and replaced with a dielectric bridge;
the method further comprising:
connecting the first and second metal contacts to a mount such that the dielectric bridge is aligned with a contact pad on the mount, wherein the contact pad is electrically connected to the second metal contact.

10. The method of claim 1 wherein forming a semiconductor structure comprises growing the semiconductor structure on a growth substrate, the method further comprising:
   connecting the first and second metal contacts to a mount; and
   removing the growth substrate.

11. The method of claim 1 further comprising:
disposing a compliant bonding structure between the semiconductor structure and a mount; and
bonding the semiconductor structure to the mount, wherein bonding causes the compliant bonding structure to collapse such that the compliant bonding structure electrically and mechanically connects the semiconductor structure to the mount and wherein the compliant bonding structure remains in a solid phase during bonding.

12. The method of claim 11 wherein the compliant bonding structure comprises a plurality of metal bumps.

13. The method of claim 12 wherein the bumps are gold.

* * * * *